(12) United States Patent
Koprivnak et al.

(10) Patent No.: US 8,898,894 B2
(45) Date of Patent: Dec. 2, 2014

(54) CAPACITOR-CIRCUIT BOARD INTERFACE FOR WELDING SYSTEM COMPONENTS

(71) Applicant: Lincoln Global, Inc., City of Industry, CA (US)

(72) Inventors: George Koprivnak, Painesville, OH (US); Robert Dodge, Mentor, OH (US); Jeremie Buday, Mentor, OH (US); David Perrin, Wadsworth, OH (US)

(73) Assignee: Lincoln Global, Inc., City of Industry, CA (US)

( * ) Notice: Subject to any disclaimer, the term of this patent is extended or adjusted under 35 U.S.C. 154(b) by 0 days.

(21) Appl. No.: 13/788,348

(22) Filed: Mar. 7, 2013

(65) Prior Publication Data

US 2013/0185933 A1    Jul. 25, 2013

Related U.S. Application Data

(62) Division of application No. 12/724,075, filed on Mar. 15, 2010, now Pat. No. 8,604,355.

(51) Int. Cl.
*H05K 3/30* (2006.01)
*H05K 3/32* (2006.01)
*B23K 9/10* (2006.01)

(52) U.S. Cl.
CPC ... *H05K 3/32* (2013.01); *B23K 9/10* (2013.01)
USPC ........... 29/832; 29/829; 29/825; 29/592.1; 29/834; 29/871; 439/48; 439/620.12; 439/620.13; 439/620.16; 439/78; 174/260; 174/75 D; 174/81; 174/72 B; 174/548; 361/807; 361/328; 361/330; 361/62; 361/821; 257/691; 257/693; 257/698; 257/E23.043

(58) Field of Classification Search
USPC ............... 29/832, 829, 825, 592.1, 834, 871; 439/48, 620.12, 620.13, 620.16, 78; 174/260, 75 D, 81, 72 B, 548, 266, 267; 361/807, 385, 62, 328–330, 381, 383, 361/386, 379, 388, 389, 407; 257/691–693, 257/698, 723, E23.043
See application file for complete search history.

(56) References Cited

U.S. PATENT DOCUMENTS

| | | | | |
|---|---|---|---|---|
| 3,200,296 | A * | 8/1965 | Bruestle | 361/709 |
| 5,214,564 | A * | 5/1993 | Metzler et al. | 361/699 |
| 5,747,773 | A * | 5/1998 | Griffin et al. | 219/130.1 |
| 5,760,361 | A * | 6/1998 | Dew et al. | 219/108 |
| 6,473,291 | B1 * | 10/2002 | Stevenson | 361/306.3 |
| 6,532,157 | B1 * | 3/2003 | Glenn et al. | 361/767 |
| 8,373,970 | B2 * | 2/2013 | Jakoubovitch | 361/502 |
| 8,436,459 | B2 * | 5/2013 | Oka et al. | 257/691 |
| 8,604,355 | B2 * | 12/2013 | Koprivnak et al. | 174/260 |
| 2009/0111294 | A1 * | 4/2009 | Barry et al. | 439/78 |

* cited by examiner

*Primary Examiner* — Peter DungBa Vo
*Assistant Examiner* — Azm Parvez
(74) *Attorney, Agent, or Firm* — Hahn Loeser & Parks LLP (57) ABSTRACT

A welding system component includes a circuit board for the welding system component. An interface has a main riser portion with a fastener passageway formed therethrough. The interface has an extension portion with a terminal passageway formed therethrough. The extension portion is electrically connected to the circuit board with a terminal disposed in the terminal passageway. The extension portion is spaced away from a surface of the circuit board. A capacitor is electrically connected to the main riser portion with a fastener disposed in the fastener passageway.

14 Claims, 6 Drawing Sheets

CAPACITOR-CIRCUIT BOARD INTERFACE FOR WELDING SYSTEM COMPONENTS

CROSS-REFERENCE TO RELATED APPLICATIONS

This application is a divisional patent application of U.S. patent application Ser. No. 12/724,075 filed 15 Mar. 2010, the contents of which are fully incorporated by reference.

TECHNICAL FIELD OF THE INVENTION

The present disclosure relates to welding system components, and more specifically, to an interface between a capacitor and circuit board for a component of a welding system.

BACKGROUND OF THE INVENTION

Welding is an important process in the manufacture and construction of various products and structures. Applications for welding are widespread and used throughout the world including, for example, the construction and repair of ships, buildings, bridges, vehicles, and pipe lines, to name a few. Welding is performed in a variety of locations, such as in a factory with a fixed welding operation or on site with a portable welder.

In automated or mechanized welding a user/operator (i.e. welder) programs or instructs welding equipment to make a weld. For example, in Submerged Arc Welding (SAW) a consumable solid or tubular (flux cored) electrode may be continuously fed into a molten weld or arc zone that is protected from atmospheric contamination by being "submerged" under flux such as a blanket of granular fusible material consisting of lime, silica, manganese oxide, calcium fluoride, or other suitable compounds. Generally, when molten, the flux becomes conductive, and provides a current path between the electrode and the work. A thick layer of flux completely covering the molten metal may thus prevent spatter and sparks as well as suppress the intense ultraviolet radiation and fumes that may be a part of the arc welding process. In such a process, currents ranging from 300 to 2000 A may be utilized. Additionally, currents of up to 5000 A may be used with multiple arcs. Single or multiple electrode wire variations of the process exist. Also, DC or AC power can be used, and/or combinations of DC and AC in multiple electrode systems. Generally, constant voltage welding power supplies are most commonly used; however, constant current systems in combination with a voltage sensing wire-feeder are also available.

In manual or semi-automated welding a user/operator (i.e. welder) directs welding equipment to make a weld. For example, in electric arc welding the welder may manually position a welding rod or welding wire and produce a heat generating arc at a weld location. In this type of welding, the spacing of the electrode from the weld location is related to the arc produced and to the achievement of optimum melting/fusing of the base and welding rod or wire metals. The quality of such a weld is often directly dependent upon the skill of the welder.

Submerged Arc Welding and Electric Arc Welding, among other types of welding, may occur in a variety of environments. As such, it is generally desirable to protect the components of welding systems for use in a variety of conditions.

In the past, various methods and devices have been used to protect the components of welding systems. For example, there has been a desire to encapsulate the circuit boards of welding components to protect them from their environment, for example with a dip-and-cure epoxy coat. However, encapsulation of these boards for environmental protection is difficult due to the need of capacitors to be mounted directly to the board. Any area for mounting of a capacitor requires damming prior to encapsulation in order to prevent encapsulation of these areas.

Additionally, connections of capacitors to circuit boards are typically high temperature connections due to the nature of the materials of capacitors. This heat is typically displaced into the circuit board and thus raises the temperature of the board and other components mounted to the board. It is desired to minimize this heat transfer from the capacitor connections to the board.

SUMMARY OF THE INVENTION

This invention relates to welding system components and an interface for capacitors and circuit boards of such components.

A welding system component includes a circuit board for the welding system component. An interface has a main riser portion with a fastener passageway formed therethrough. The interface has an extension portion with a terminal passageway formed therethrough. The extension portion is electrically connected to the circuit board with a terminal disposed in the terminal passageway. The extension portion is spaced away from a surface of the circuit board. A capacitor is electrically connected to the main riser portion with a fastener disposed in the fastener passageway.

One aspect of the invention includes a method of assembling a welding system component using the steps of: providing a circuit board for a welding system component, providing an interface including a main riser portion with a fastener passageway formed therethrough, and an extension portion with a terminal passageway formed therethrough, providing at least one capacitor, electrically connecting the main riser portion to the at least one capacitor with a fastener disposed in the fastener passageway, and electrically connecting the circuit board to the extension portion with a terminal disposed in the terminal passageway such that the extension portion is spaced away from a surface of the circuit board.

Various aspects will become apparent to those skilled in the art from the following detailed description and the accompanying drawings.

BRIEF DESCRIPTION OF THE DRAWINGS

FIG. 4b is a front view of the portion of the circuit board assembly shown in FIG. 4a.

DETAILED DESCRIPTION OF THE INVENTION

The best mode for carrying out the invention will be described for the best mode known to the applicant at the time. The examples and figures are illustrative only and not meant to limit the invention, as measured by the scope and spirit of the claims.

Figure 1:
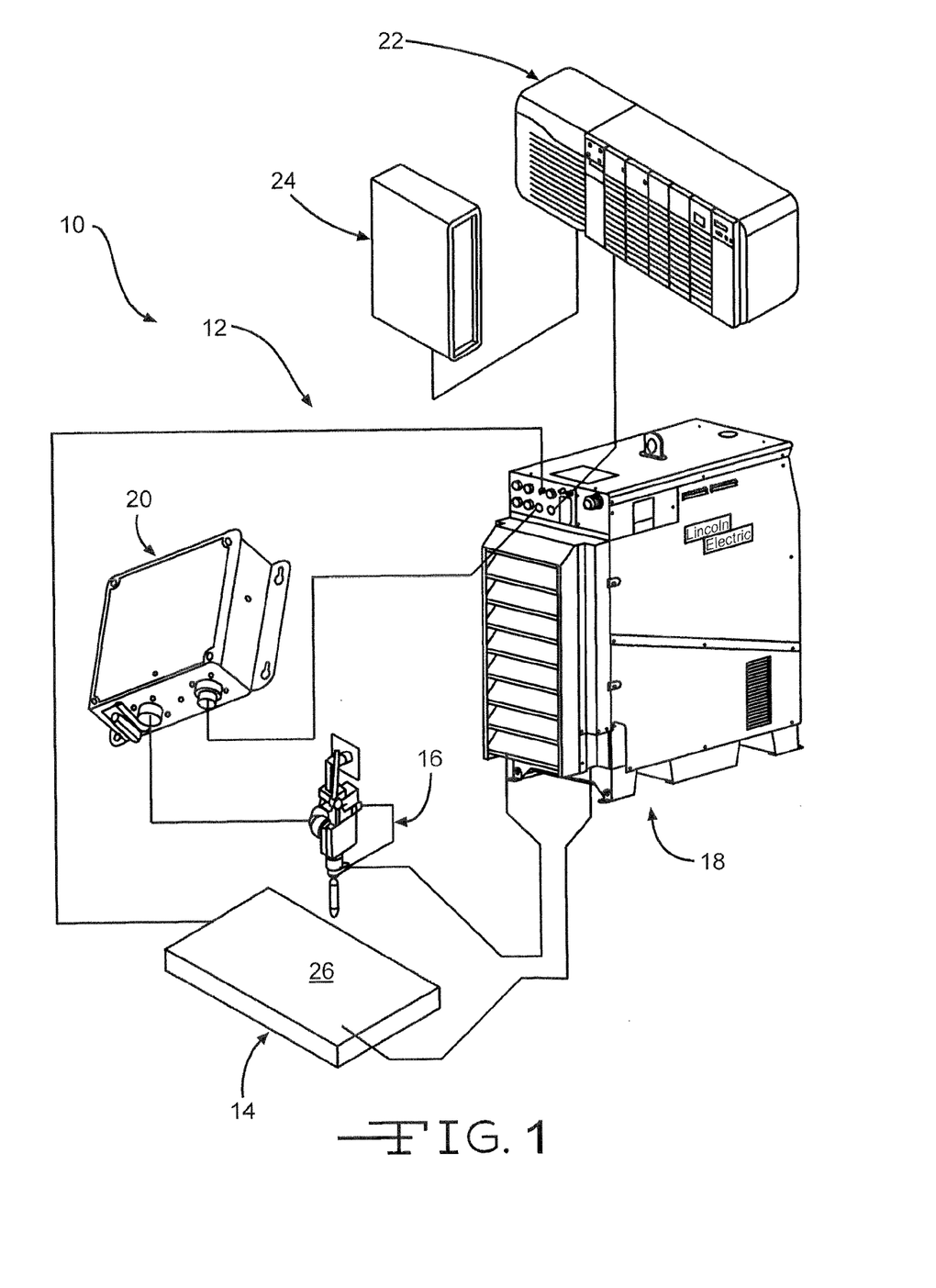
FIG. 1 is a schematic view of a welding environment.

Referring now to the drawings, there is illustrated in FIG. 1 welding environment 10. Welding environment 10 includes welding system 12, and work piece 14. Welding system 12 includes welding gun 16 with a wire feed passage connected to a wire feeder (not shown) and with an electrode connected to welding power supply 18. Exemplary welding environment 10 also includes wire feed controller 20 and power controller 22 with user interface 24 for programming and monitoring system 12. welding environment may also, for example, include a stick electrode holder, TIG torch or other apparatus for use with electric arc welding or other equipment as appropriate for other types of welding.

Work piece 14 and proximate space generally defines welding work area 26 where the welding gun may be used to form a weld. Various types of exemplary welding, including Submerged Arc Welding (SAW), Shielded Metal Arc Welding (SMAW), Gas Metal Arc Welding (GMAW) e.g. MIG Welding, and Gas Tungsten Arc Welding (GTAW) e.g. TIG welding, may be conducted in the welding environment.

Welding system 12 includes welding equipment, such as welding power supply 18, for generating a welding current and voltage, a welding control system for controlling the welding current and voltage, and a monitoring system for monitoring the welding current and voltage. The monitoring system may also monitor a variety of other operating parameters, such as but not limited to, welding wire feed speed, amount of welding wire remaining, any type of welding feedback desired by the operator, and any other desired operating parameters.

Figure 2:
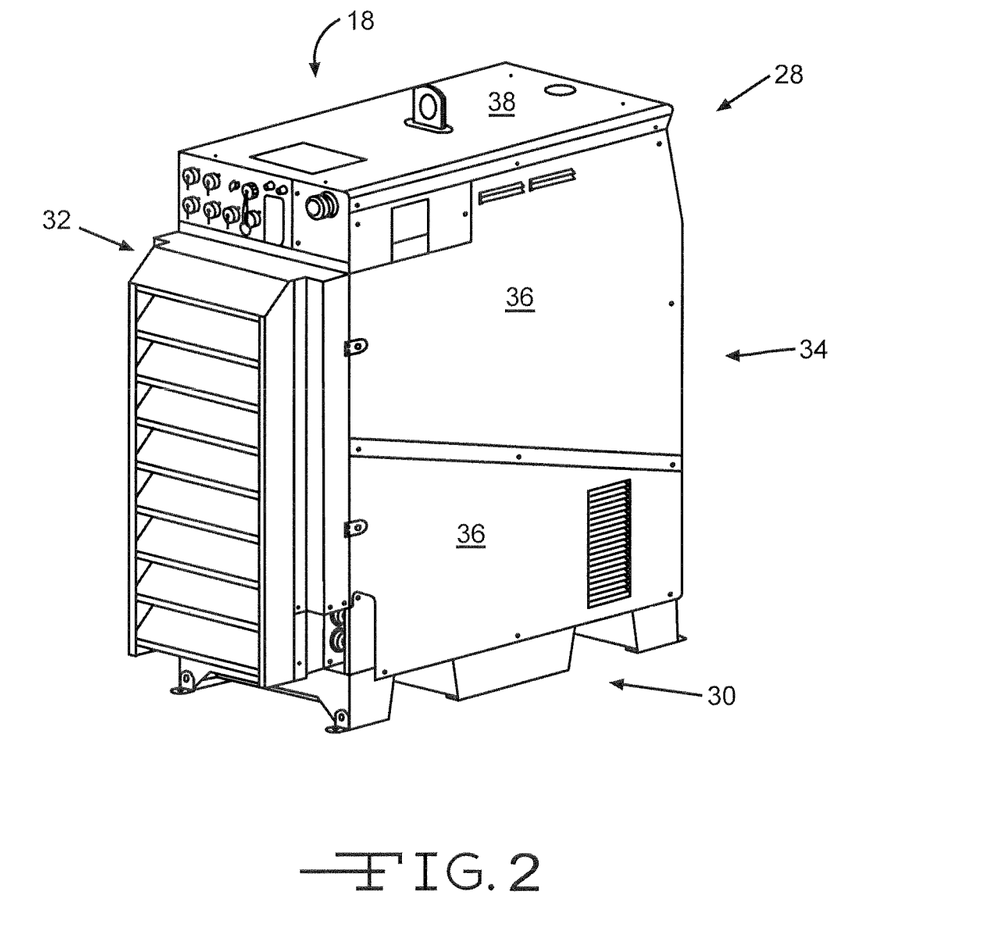
FIG. 2 is a perspective view of the welder of FIG. 1.
Figure 3:
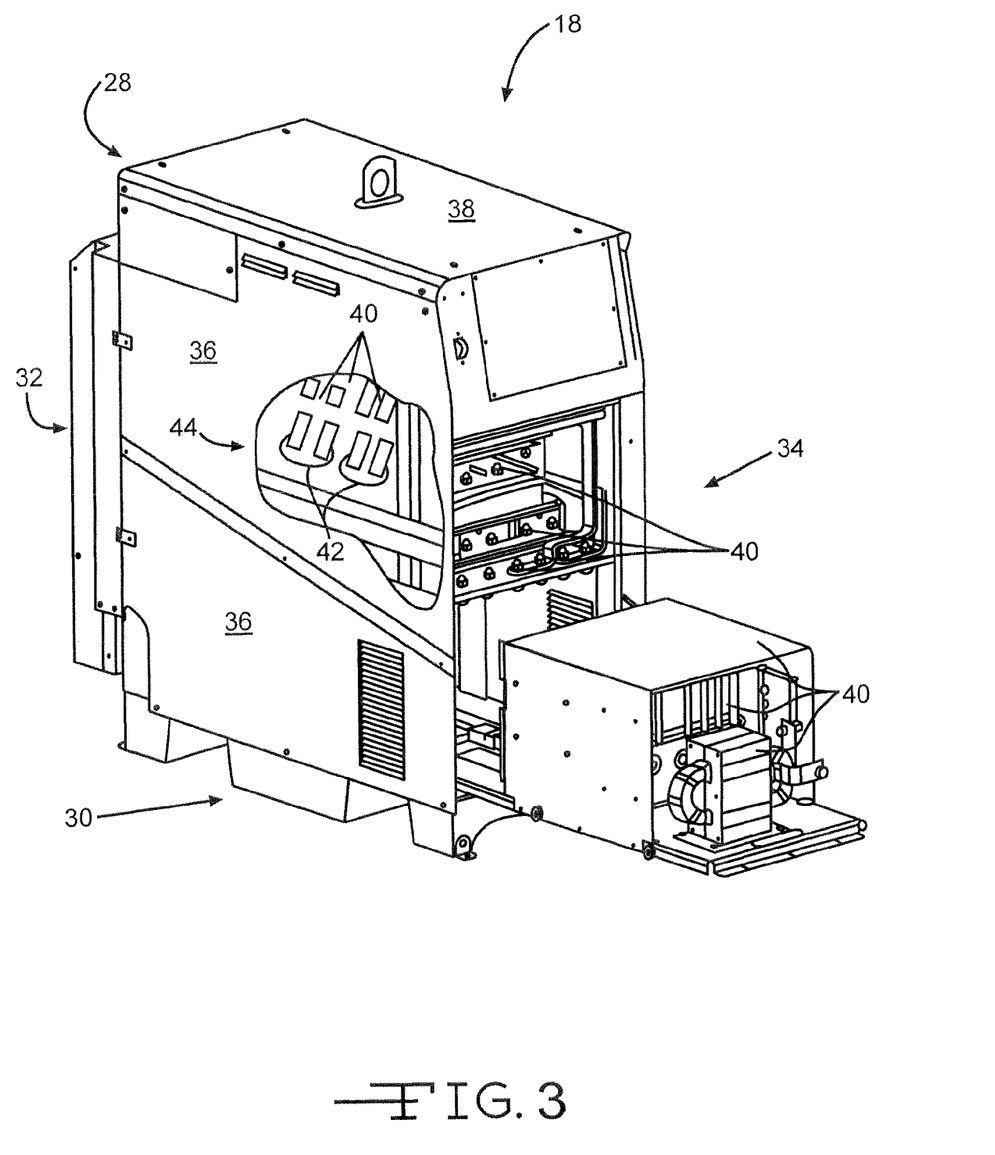
FIG. 3 is an enlarged view of a portion of the welder of FIG. 2 shown with the access panel shown partially cut away.

In one embodiment, as best shown in FIGS. 2 and 3, welding power supply 18 is illustrated for line powered welding, e.g. welding supplied with electric power from a power grid. However it must be understood that welding power supply 18 may be for other types of welding, such as engine welding, e.g. with a motor-generator. Welding power supply 18 includes cabinet 28 that is suitable to house equipment that supplies power to output leads for welding.

Cabinet 28 includes base 30, an access panel 32, control panel 34, side panels 36 and cover 38.

Access panel 32 may include optional air louvers. Access panel 32 may provide access to an optional fan(s), such as an impeller or blower disposed in cabinet 28.

Welding power supply 18 or user interface may optionally include a number of input devices, such as a knob, slides, switches, buttons or other digital or analog controls , for example to adjust the output of the welder or perform other control operations, e.g. welding mode, arc control, etc, and may be mounted on control panel 34. Additionally, display devices may also fastened to welding power supply 18 or user interface for display of operation parameters of welding system 12, as well as optional gauges. The input devices may be associated with a control board with or without an optional chopper.

As best shown in FIG. 3, welding power supply 18 also includes various electronic components 40 as desired, such as switches, resistors, rectifiers, diodes, power control boards, and capacitors 42. As desired, a variety of these components maybe mounted within a compartment in cabinet 28 adjacent control panel 34. As such, in the illustrated example, they are accessible through a front opening associated with control panel 34.

Figure 4A:
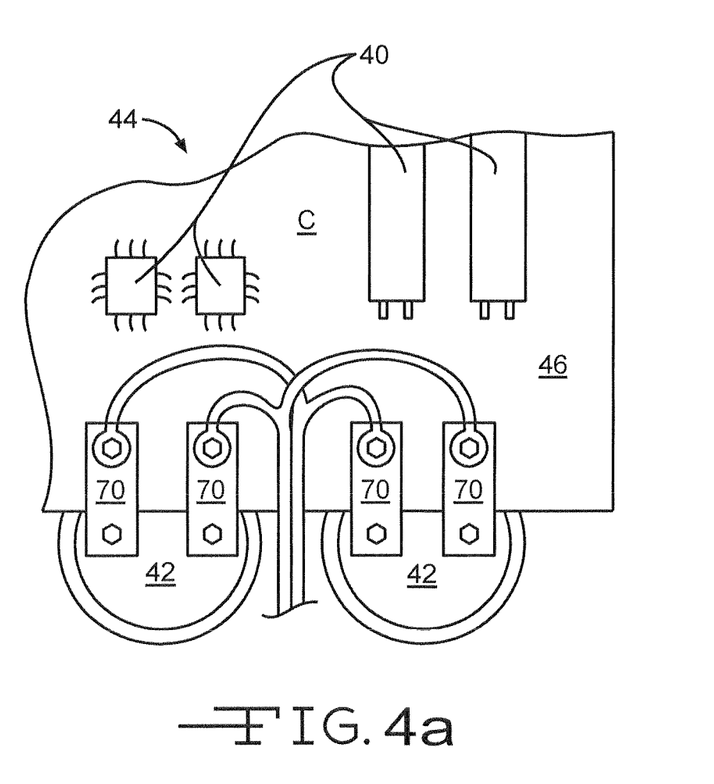
FIG. 4a is a top view of a portion of the circuit board assembly shown in FIG. 3.
Figure 4B:
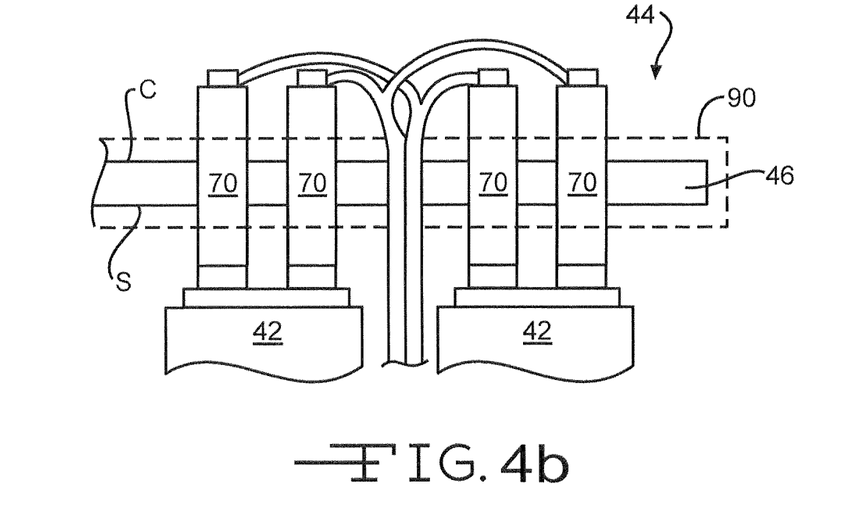

An exemplary circuit board assembly 44 for association with capacitors 42 is shown in FIGS. 4a and 4b. Circuit board assembly 44 includes circuit board 46 that has solder side "S" and component side C. Circuit board assembly 44 may optionally include a number of associated electrical components 40 electrically connected to circuit board 46. Additionally, an optional heat sink assembly (not shown) may be thermally connected to circuit board 46.

Figure 5:
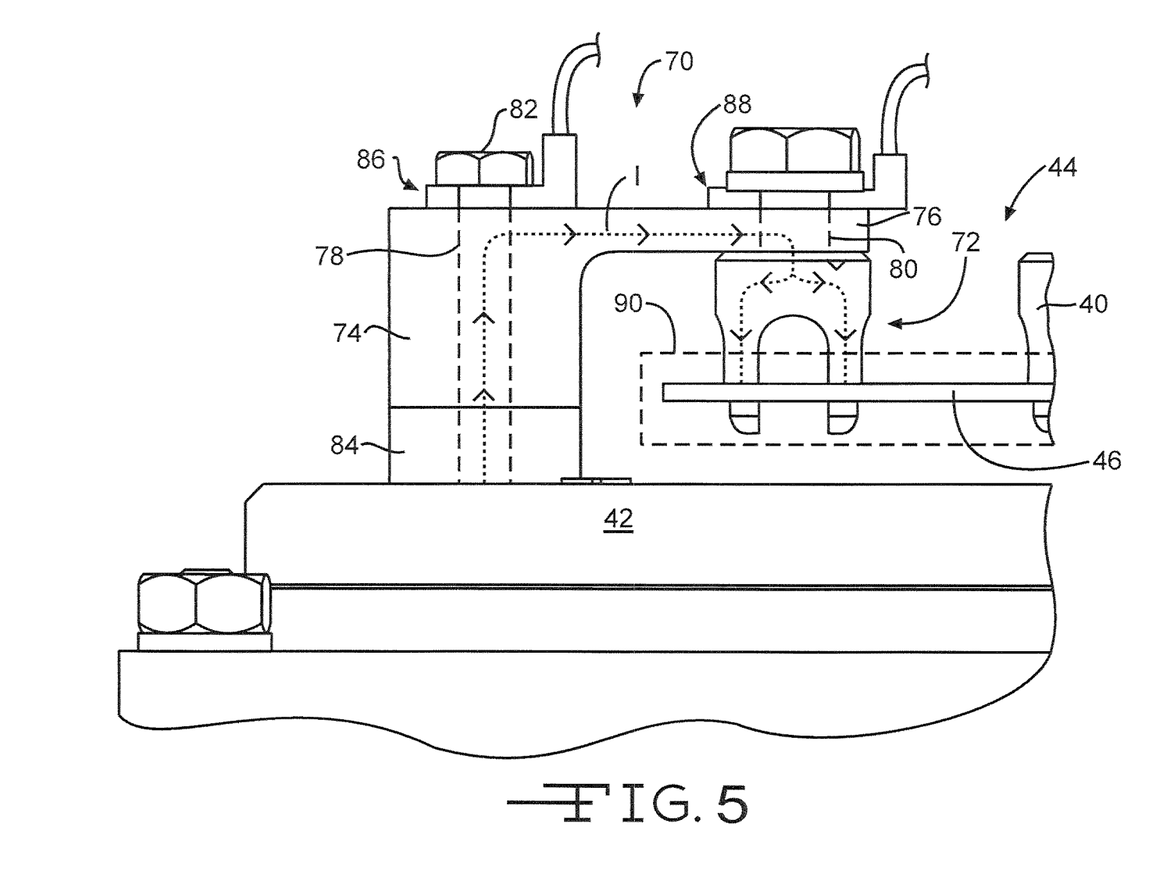
FIG. 5 is an enlarged side view of a portion of the circuit board assembly of FIG. 4b.
Figure 6:
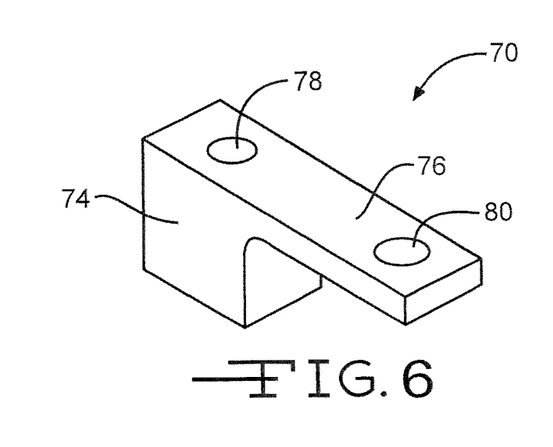
FIG. 6 is a perspective view of the interface of FIG. 5.
Figure 7:
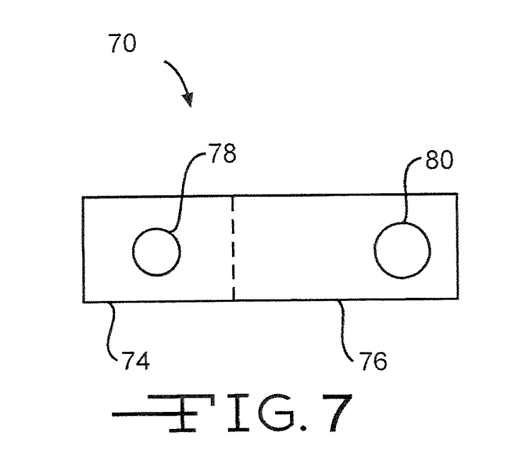
FIG. 7 is a top view of the interface of FIG. 6.
Figure 8:
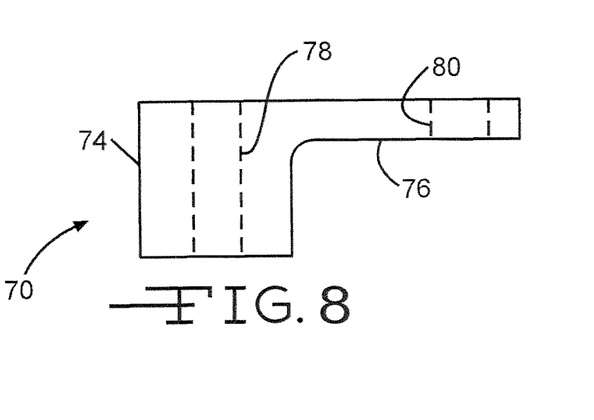
FIG. 8 is a side view of the interface of FIG. 6.
Figure 9:
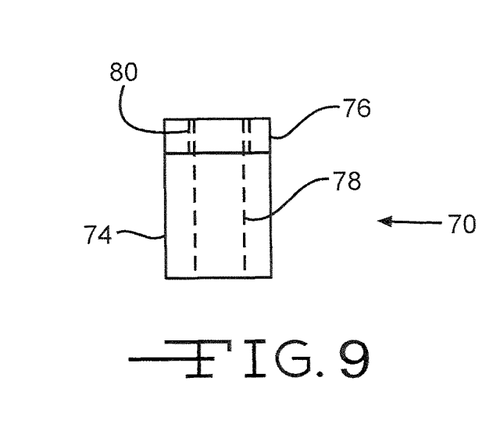
FIG. 9 is a front view of the interface of FIG. 6.

As best shown in FIG. 5, capacitor 42 is connected to circuit board 46 by at least one interface 70. Circuit board assembly 44 includes a pair of mounting terminals (one shown); positive mounting terminal 72 and a negative mounting terminal (not shown) each connected to respective interface 70. FIGS. 5-9 are described with regard to positive mounting terminal 72. It must be understood however, that the connection to an arrangement of the negative mounting terminal (not shown) and respective interface 70 a similar to that of positive mounting terminal 72 as described below, except as otherwise noted.

As best shown in FIGS. 5-9, interface 70 includes main riser portion 74 and an extension portion 76 which generally extends a distance in a direction that is substantially normal to the longitudinal direction of main riser portion 74, although such is not required. Exemplary interface 70 is machined from a single piece of copper. However, it must be understood that interface 70 may be formed from any other suitable material, such as copper alloy, aluminum, aluminum alloy or any other material suitable to support capacitor 42 and form an electrically conductive path between circuit board 46 and capacitor 42.

Interface 70 may act as a heat sink and reduce heat from circuit board 46 and/or capacitor 42. This tends to protect circuit board 46 and allow components 40 connected there to run cooler, as compared to when capacitor 42 is connected directly to circuit board 46. As a result, a plurality of capacitors 42 may be bussed together, as illustrated in FIGS. 4a and 4b, and/or be placed closer together on circuit board 46 than otherwise would be the case. Additionally, this configuration minimizes inductance in during the setup of circuit board assembly 44. It is noted that in at least one configuration circuit board 46 may include a thick copper substrate upon which other layers and components are placed.

Main riser portion 74 includes fastener passageway 78 formed therethrough. Extension portion 76 extends from one end of main riser portion 74 and includes terminal passageway 80 formed there through.

Fastener passageway 78 is formed such that fastener 82, such as a bolt or other fastening device, may be disposed therein to fasten interface 70 to capacitor 42, either directly or with an optional component mount 84, which, for example, may be made of a different material than interface 70. Interface 70 may optionally be fastened to capacitor 42 by clips, screws, pins or any other mechanism suitable to electrically connect interface 70 to capacitor 42. Further, as illustrated, fastener 82 provides an optional first positive lead connection 86 such that one or more leads may be mounted to the top of interface 70 to electrically connect to board 46 and/or capacitor 42. Additionally or alternatively an optional washer may be disposed between the end of fastener 82 and the surface of interface 70.

Terminal passageway 80 is formed such that terminal 72 may be disposed therein to mount circuit board 46 to interface 70 and electrically connect capacitor 42 to circuit board 46. Terminal 72 may be fastened to interface 70 by a bolt, clip, screw, pin or any other mechanism suitable to electrically connect circuit board 46 to interface 70. Further, as illustrated, the connection to terminal 72 may provide an optional second positive lead connection 88 such that one or more leads may be mounted to the top of interface 70 to electrically connect to circuit board 46 and/or capacitor 42. It must be understood that interface 70 associated with the negative mounting terminal (not shown) may also have similar first and second negative lead connections such that one or more leads may be mounted to the top of interface 70 associated with the negative mounting terminal (not shown) to electrically connect to board 46 and/or capacitor 42. Additionally or alternatively an optional washer may be disposed between the end of terminal 72 and the surface of interface 70.

As illustrated in FIG. 5, in the case of positive mounting terminal 72, current "I" flow in a direction from capacitor 42 along main riser portion 74 and/or fastener 82, through extension portion 76 and to positive mounting terminal 72. In the case of the negative mounting terminal (not shown) current will flow in a direction exactly opposite to that for positive mounting terminal 72. In the illustrated embodiment current flow "I" in positive mounting terminal 72 is between extension portion 76 and to the surface of circuit board 46.

During assembly, terminal 72 may be connected to component side "C" of circuit board 46, along with any desired components 40. After terminal 72 is connected to circuit board 46, main riser portion 74 extends away from the surface of circuit board 46 with extension portion 76 being elevated off the surface of circuit board 46. In the illustrated embodiment main riser portion 74 extends generally orthogonally to the surface of circuit board 46 with extension portion 76 extending generally parallel to the surface of circuit board 46.

Circuit board 46 may optionally be covered with encapsulation material 90. Subsequently, capacitor 42 and interface 70 may then be connected to circuit board 46.

Alternatively, portions of the circuit board 46 may be dammed as desired, circuit board 46 covered with encapsulation material 90 and terminal 72 and other components 66 then connected, with capacitor 42 and interface 70. Further in the alternative, terminal 72, and thus interface 70, may be mounted on solder side "S" of circuit board 46 such that capacitor 42 may be positioned on solder side "S" and thus allow a connection to be made to component side "C" at a minimal distance.

Once interface 70 is connected to circuit board 46, main riser portion 74 extends away from the surface of circuit board 46 with extension portion 76 being elevated off the surface of circuit board 46. In the illustrated embodiment main riser portion 74 extends generally orthogonally to the surface of circuit board 46 with extension portion 76 extending generally parallel to the surface of circuit board 46.

It is noted that in one assembly the connections to terminal 72 may be made with greater force than the connections to fastener 82. For example, fastener 82 may be tightened with 10 to 15 inch-pounds of torque, while the terminal may be tightened with 50 inch-pounds of torque or more.

As well as during normal operation, interface 70 may reduce unwanted heat from being absorbed circuit board 46 during assembly. Main riser portion 74 and extension portion 76 disrupt the heat from capacitor 42 from being absorbed into circuit board 46. Additionally, as a plurality of capacitors 42 may be bused together and be placed relatively closely together on circuit board 46, it is contemplated that the plurality of interfaces 70 may be mounted relatively closely together during assembly.

While principles and modes of operation have been explained and illustrated with regard to particular embodiments, it must be understood, however, that this may be practiced otherwise than as specifically explained and illustrated without departing from its spirit or scope.

What is claimed is:

1. A method of assembling a welding system component comprising:
   providing a circuit board for a welding system component,
   providing an interface including a main riser portion extending generally orthogonally to a surface of the circuit board with a fastener passageway formed therethrough, and an extension portion extending generally parallel to the surface of the circuit board with a terminal passageway formed therethrough,
   providing at least one capacitor,
   electrically connecting the main riser portion to the at least one capacitor with a fastener disposed in the fastener passageway,
   electrically connecting the circuit board to the extension portion with a terminal disposed in the terminal passageway such that the extension portion is spaced away from a surface of the circuit board and from a surface of said at least one capacitor, said circuit board and said at least one capacitor in non-contacting physical relationship other than through said interface,
   the interface acting both as an electrically conductive path between said at least one capacitor and the circuit board and as a heat sink which reduces heat from the circuit board and the at least one capacitor as compared to when the at least one capacitor is directly connected to the circuit board.

2. The method of assembling a welding system component of claim 1 further comprising the step of:
   at least partially covering the circuit board with an encapsulation material.

3. The method of assembling a welding system component of claim 1 where
   the step of at least partially covering occurs before the step of electrically connecting the circuit board to the extension portion.

4. The method of assembling a welding system component of claim 1 further comprising the steps of:
   providing a second interface including a main riser portion with a fastener passageway formed therethrough, and an extension portion with a terminal passageway formed therethrough,
   electrically connecting the main riser portion of the second interface to the at least one capacitor with a second fastener disposed in the fastener passageway of the second interface, and
   electrically connecting the circuit board to the extension portion of the second interface with a second terminal disposed in the terminal passageway of the second interface such that the extension portion of the second interface is spaced away from a surface of the circuit board.

5. The method of assembling a welding system component of claim 1, where the at least one capacitor is a first capacitor and a second capacitor, and further comprising the steps of:
   electrically connecting the second capacitor to the circuit board, and
   bussing the second capacitor with the first capacitor.

6. The method of assembling a welding system component of claim 1 where
   the interface is machined from a single piece of metal.

7. The method of assembling a welding system component of claim 6 where
   the metal for the interface is selected from the group consisting of copper, aluminum or aluminum alloys.

8. A method of assembling a welding system component comprising:
   providing a circuit board for a welding system component,
   providing an interface machined out of single piece of metal, including a main riser portion extending generally orthogonally to a surface of the circuit board with a fastener passageway formed therethrough, and an extension portion extending generally parallel to the surface of the circuit board with a terminal passageway formed therethrough, providing at least one capacitor, electrically connecting the main riser portion to the at least one capacitor with a fastener disposed in the fastener passageway, electrically connecting the circuit board to the extension portion with a terminal disposed in the terminal passageway such that the extension portion is spaced away from a surface of the circuit board, the circuit board and the at least one capacitor in non-contacting physical relationship other than through said interface, the interface acting both as an electrically conductive path between said at least one capacitor and the circuit board and as a heat sink which reduces heat from the circuit board and the at least one capacitor as compared to when the at least one capacitor is directly connected to the circuit board.

9. The method of assembling a welding system component of claim 8 further comprising the step of:
at least partially covering the circuit board with an encapsulation material.

10. The method of assembling a welding system component of claim 8 where
the step of at least partially covering occurs before the step of electrically connecting the circuit board to the extension portion.

11. The method of assembling a welding system component of claim 8 further comprising the steps of:
providing a second interface including a main riser portion with a fastener passageway formed therethrough, and an extension portion with a terminal passageway formed therethrough, electrically connecting the main riser portion of the second interface to the at least one capacitor with a second fastener disposed in the fastener passageway of the second interface, and electrically connecting the circuit board to the extension portion of the second interface with a second terminal disposed in the terminal passageway of the second interface such that the extension portion of the second interface is spaced away from a surface of the circuit board.

12. The method of assembling a welding system component of claim 8, where the at least one capacitor is a first capacitor and a second capacitor, and further comprising the steps of:
electrically connecting the second capacitor to the circuit board, and bussing the second capacitor with the first capacitor.

13. The method of assembling a wielding system component of claim 8 where
the interface is machined from a single piece of metal.

14. The method of assembling a welding system component of claim 13 where
the metal for the interface is selected from the group consisting of copper, aluminum or aluminum alloys.

\* \* \* \* \*

UNITED STATES PATENT AND TRADEMARK OFFICE
CERTIFICATE OF CORRECTION

PATENT NO. : 8,898,894 B2
APPLICATION NO. : 13/788348
DATED : December 2, 2014
INVENTOR(S) : Koprivnak et al.

Page 1 of 1

It is certified that error appears in the above-identified patent and that said Letters Patent is hereby corrected as shown below:

In the Claims

Claim 8, Col. 6, line 65: insert --a-- before single piece.

Claim 13, Col. 8, line 23: delete "wielding" and insert --welding--.

Signed and Sealed this
Seventeenth Day of March, 2015

Michelle K. Lee
*Director of the United States Patent and Trademark Office*